(12) United States Patent
AlQahtani et al.

(10) Patent No.: US 9,816,366 B2
(45) Date of Patent: Nov. 14, 2017

(54) METHODS, SYSTEMS, AND COMPUTER MEDIUM HAVING COMPUTER PROGRAMS STORED THEREON TO OPTIMIZE RESERVOIR MANAGEMENT DECISIONS

(71) Applicants: Saudi Arabian Oil Company, Dhahran (SA); Texas Tech University System, Lubbock, TX (US)

(72) Inventors: Ghazi D. AlQahtani, Lubbock, TX (US); Mohamed Y. Soliman, Houston, TX (US); Ismael Regis de Farias, Jr., Lubbock, TX (US)

(73) Assignees: Saudi Arabian Oil Company, Dhahran (SA); Texas Tech University System, Lubbock, TX (US)

( * ) Notice: Subject to any disclaimer, the term of this patent is extended or adjusted under 35 U.S.C. 154(b) by 615 days.

(21) Appl. No.: 14/330,324

(22) Filed: Jul. 14, 2014

(65) Prior Publication Data
US 2016/0010444 A1    Jan. 14, 2016

(51) Int. Cl.
G06G 7/48  (2006.01)
E21B 43/30  (2006.01)
(Continued)

(52) U.S. Cl.
CPC .......... *E21B 43/30* (2013.01); *E21B 41/0092* (2013.01); *G01V 99/005* (2013.01); *G06F 17/5009* (2013.01); *G06Q 10/04* (2013.01)

(58) Field of Classification Search
None
See application file for complete search history.

(56) References Cited

U.S. PATENT DOCUMENTS 7,389,185 B2    6/2008  Craig
7,620,534 B2    11/2009  Pita et al.
(Continued)

FOREIGN PATENT DOCUMENTS

WO    0123829 A2    4/2001
WO    2009105650 A1    8/2009
WO    2010080270 A1    7/2010

OTHER PUBLICATIONS

Ding, D.Y., "Optimization of Well Placement Using Evolutionary Algorithms", Jun. 9-12, 2008, SPE Europec/EAGE Annual Conference and Exhibition, Society of Petroleum Engineers.*
(Continued)

*Primary Examiner* — Cedric D Johnson
(74) *Attorney, Agent, or Firm* — Bracewell LLP; Constance G. Rhebergen; Albert B. Kimball, Jr.

(57) ABSTRACT

Embodiments of the invention include systems, methods, and computer-readable mediums for optimizing the placement of wells in a reservoir. Embodiments include, for example, determining for a reservoir a productivity index for each coordinate of a reservoir using reservoir metrics associated with the reservoir, generating a grid pattern of the reservoir using the productivity index with time values extracted for each coordinate, determining a total dynamic productivity index for each coordinate, and determining placement of one or more wells responsive to the total dynamic productivity index and minimum spacing between the one or more wells. Embodiments further include, for example, generating a production analysis report for the reservoir that includes an assessment of well placement and generating a wells placement map using one or more total dynamic productivity index indicators.

13 Claims, 7 Drawing Sheets

(51) Int. Cl.
    E21B 41/00      (2006.01)
    G01V 99/00      (2009.01)
    G06F 17/50      (2006.01)
    G06Q 10/04      (2012.01)

(56) References Cited

U.S. PATENT DOCUMENTS

| | | | |
|---|---|---|---|
| 7,874,357 | B2 | 1/2011 | Jalali et al. |
| 7,983,885 | B2 | 7/2011 | Suarez-Rivera et al. |
| 8,280,695 | B2 | 10/2012 | Neelamani et al. |
| 2007/0016389 | A1 | 1/2007 | Ozgen |
| 2007/0038375 | A1 | 2/2007 | Jalali et al. |
| 2007/0083331 | A1 | 4/2007 | Craig |
| 2007/0255500 | A1 | 11/2007 | Pita et al. |
| 2008/0167849 | A1 | 7/2008 | Hales et al. |
| 2010/0084131 | A1 | 4/2010 | Bouzas et al. |
| 2010/0114544 | A1* | 5/2010 | Dogru ............... G01V 11/00 703/10 |
| 2010/0299125 | A1* | 11/2010 | Ding ................... E21B 43/12 703/10 |
| 2011/0022368 | A1 | 1/2011 | Huang et al. |
| 2013/0268248 | A1 | 10/2013 | Bouzarkouna et al. |

OTHER PUBLICATIONS

A. Y. Bukhamsin, M. M. Farshi, and K. Aziz, "Optimization of Multilateral Well Design and Location in a Real Field Using a Continuous Genetic Algorithm," SPE 136944 Annual Technical Conference and Exhibition, 2010.

C. L. Farmer, J. M. Fowkes, and N. I. M. Gould, "Optimal Multilateral Well Placement," Oxford University Mathematical Institute, No. 10, pp. 1-13, 2010.

International Search Report and Written Opinion for related PCT application PCT/US2015/039710 dated Oct. 9, 2015.

J. E. Onwunalu and L. J. Durlofsky, "A New Well-Pattern-Optimization Procedure for Large-Scale Field Development," SPE Journal, No. Sep. 2011.

J. M. Harris, J. L. Hirst, and M. J. Mossinghoff, Combinatorics and Graph Theory, Second Edi. Springer, 2008, p. 34.

J. Onwunalu, "Optimization of Nonconventional Well Placement Using Genetic Algorithms and Statistical Proxy," 2006.

M. M. Saggaf, "A Vision for Future Upstream Technologies," SPE 109323 Journal of Petroleum Technology, Mar. 2008.

P. S. Cruz, R. N. Horne, U. Stanford, C. V Deutsch, and U. Alberta, "The Quality Map: A Tool for Reservoir Uncertainty Quantification and Decision Making," SPE Annual Technical Conference and Exhibition, No. Dec. 2003, pp. 3-6, 2004.

R. K. Ahuja, T. L. Magnanti, and J. B. Orlin, Network Flows: Theory, Algorithms, and Applications. Prentice-Hall, Inc, 1993, p. 23-31.

S. Dasgupta, C. H. Papadimitriou, and U. V Vazirani, Algorithms. McGraw-Hill, 2006, p. 21.

V. Artus, L. J. Durlofsky, J. Onwunalu, and K. Aziz, "Optimization of Nonconventional Wells Under Uncertainty Using Statistical Proxies," Computational Geosciences, vol. 10, No. 4, pp. 389-404, 2006.

Y. Burak, L. Durlofsky, and A. Khalid, "Optimization of Nonconventional Well Type, Location and Trajectory," SPE 77565 Annual Technical Conference and Exhibition, Sep. 2002.

AlQahtani et al. "A Comparison between Evolutionary Metaheuristics and Mathematical Optimization to Solve the Wells Placement Problem" Advances in Chemical Engineering and Science, Aug. 17, 2013, 3, pp. 30-36.

Ding, D.Y. "Optimization of Well Placement Using Evolutionary Algorithms" SPE Europec/EAGE Annual Conference and Exhibition, Rome, Italy, Jun. 9-12, 2008, SPE 113525, pp. 1-18.

Siu et al. "Re-Engineering the Well Calibration Procedure for a Large Number of High Productivity Wells" SPE Reservoir Simulation Symposium, Houston, Texas, Feb. 11-14, 2001, SPE 66385, pp. 1-9.

Vasantharajan et al. "Well Site Selection Using Integer Programming Optimization" in Proceedings of IAMG'97, V. Pawlowsky-Glahn (Ed.), CIMNE, Barcelona, 1997, pp. 421-426.

* cited by examiner

METHODS, SYSTEMS, AND COMPUTER MEDIUM HAVING COMPUTER PROGRAMS STORED THEREON TO OPTIMIZE RESERVOIR MANAGEMENT DECISIONS

CROSS-REFERENCE TO RELATED APPLICATIONS

The present invention relates to optimizing the placement of wells in an oilfield, as does a commonly owned, co-pending U.S. Patent Application titled, "Multilateral Wells Placement via Transshipment Approach" filed Jul. 14, 2014, Ser. No. 14/330,510, which is incorporated herein by reference in its entirety.

FIELD OF THE INVENTION

This invention relates to optimizing the placement of wells in an oilfield. More specifically, this invention relates to wells placement optimization and reservoir management using total dynamic productivity index maps.

BACKGROUND OF THE INVENTION

Identifying the optimum production strategy for a field development plan is a critical decision to be made with reservoir management. Drilling of wells is costly, often amounting to hundreds of millions of dollars for a reservoir, depending on the number and types of wells involved. Once wells are drilled, there is no flexibility in changing surface locations later. The only possible alteration is to call workover rigs to sidetrack or recomplete the low profile wells, but the surface location will remain unchanged. Typically, the selection process for locating wells utilizes available technology such as saturation applications, pressure distribution maps, isopach maps, rock quality maps, and so forth. The selection process also employs, to some degree, experience and intuition. The current worldwide decline in new hydrocarbon reservoir discoveries dictates that locating and placing wells be more justified by reducing the intuition involved and including robust optimization process to improve the quality of wells placement for optimal recovery.

Assessing wells placement is usually a two step process. The first part of the process is to identify sweet spots in a reservoir. The second step includes the optimization formulation or method to be used. Several methods are known to identify sweet spots in a reservoir. One known technique is Genetic Unit (GU) which designates distinctive parts of the reservoir rock based on static properties such as geometrical, petrophysical, and spatial properties. The objective using GU is to optimize horizontal or high angle well trajectories, which are defined by azimuth, location, inclination, and length, in order to maximize productivity and drainage by intersecting high permeability GUs. The ultimate goal is to develop trajectories that interconnect with a larger number of productive GUs and rank them based on their values and the associated risk with each trajectory. This method utilizes static data solely, and the ranking criterion used are objective.

Computer programs have also been written to calculate three dimensional geo-object properties such as porosity, permeability, and lithofacies. One means that can be used as a net indicator is to represent each cell in a model which can be ranked according to its connectivity and then used to place wells. This has been extended by incorporating geologic uncertainty with an optimization set-up where the objective is to maximize the connected geo-objects that are meant to intersect with a minimum number of planned wells. For the optimization loop, a simulated annealing algorithm is used to find the best location for vertical, deviated, and horizontal wells.

Another approach computes two-dimensional indicators, referred to as reservoir quality, for each cell in a reservoir model. The quality term represents connected net pay modified by tortuosity. Binary integer programming can be used to find the best well sites with the goal of maximizing reservoir quality and incorporating minimum spacing between wells. This work has been extended into three-dimensional models in which the combination of quality indicators and geo-objects is used to identify optimum completions.

Another method has been suggested in which a productivity proxy function is created attempting to account for possible attributes by compacting grid blocks in a reservoir model. The productivity potential map accounts for porosity, permeability, and oil saturation. This method can also join preferred phase pressure and distance to the nearest boundary to the productivity proxy function to guide wells placement strategy in bottom water drive reservoirs.

A further method has identified multiple well targets to be maximized by utilizing two categories of filters. The first is the contact between the wells and the ranked pore volume measures in certain drainage radius. The other category includes permeability, distance from fluid contacts, and saturation. The resulting targets accommodate spacing constraints before establishing well paths or plans that follow certain designs for different types of wells. The goal of this method is to find the optimum location and types for production or injection wells by maximizing total hydrocarbon production or net present value. The method links optimization scheme with a reservoir stimulator and allows limited movements for each well type in order to achieve the highest objective function.

These methods discussed use mainly static parameters. Static parameter utilization, however, is not sufficient to find the optimum location of wells. In fact, once the field starts producing, parameters will start changing due to fluid flow, change in fluid saturation, and so forth. Therefore, it is accepted by the industry that dynamic maps generated from the dynamic parameters provide accurate images showing the quality of a reservoir rock relative to the active forces within.

The other category of sweet spots delineation is based on dynamic measures. Quality map term is a form of analysis where a single vertical well is placed in different area grid locations in a model to create two-dimensional cumulative oil maps. Ideally, the model is run for every well on several grid locations for a sufficient amount of time to understand trends in collective oil volume produced. This approach can be used to locate wells with an optimization algorithm under geological uncertainty. Later, the quality map approach can be used to generate quality maps for oil, gas, and water production to improve the initial population in wells placement optimization processes using genetic algorithm. The best producer locations are identified using oil and gas quality maps, and the beta injector locations are determined using water quality maps, which yield the maximization of either cumulative hydrocarbon or net present value.

Others have used the productivity index as an objective function to be maximized by optimum well locations. Numerical productivity index and field productivity index have been suggested as two different attributes to be maximized. The values of the numerical productivity index can be obtained from the production of horizontal wells in a reservoir model. A field productivity index can be obtained by the calculation of flow rate over total drawdown for one large time step. These attributes can be used with a variance matrix adaptation algorithm to find the optimum wells placement.

The quality maps approach has enticed many researchers and has been used more often when compared with other methods. The fact that it requires long simulation runs to obtain one map, especially in large models, could cause researchers to shy away from implementing quality maps approach in real reservoirs.

SUMMARY OF THE INVENTION

There is still a need for a method to identify sweet spots in a reservoir using total productivity index calculations that yields more accurate results. Embodiments of the present invention relate to optimizing the placement of wells in an oilfield. More specifically, embodiments of this invention relate to wells placement optimization and reservoir management using total dynamic productivity index maps.

In an embodiment of the invention, the invention provides systems, methods, and computer medium having computer programs stored thereon that facilitate selection of wells placement for a given reservoir. In an embodiment of the invention, the invention provides an online wells placement analysis system. The system includes one or more processors, an input/output unit adapted to be in communication with the one or more processors, one or more reservoir databases in communication with the one or more processors to store and associate a plurality of reservoir metrics with a plurality of coordinates, one or more electronic interfaces positioned to display an online reservoir analysis report, and non-transitory computer-readable medium in communication with the one or more processors and having one or more computer programs stored thereon including a set of instructions that when executed by one or more processors cause the one or more processors to perform operations. The operations include, for example, generating a reservoir analysis interface to display to a user thereof one or more online reservoir analysis reports, the reservoir analysis interface allowing an input of one or more reservoir metrics. The operations also include determining, by one or more processors, for a reservoir for each coordinate responsive to one or more of a plurality of reservoir metrics. The operations further include determining, by one or more processors, a total dynamic productivity index for each coordinate responsive to determining the productivity index for each coordinate. The operations further include determining placement of one or more wells for the reservoir responsive to determining the total dynamic productivity index for each coordinate. According to some embodiments, the reservoir has a length of $X_n$, a width of $Y_n$, and depth of $Z_n$, and the productivity index and the total dynamic production index are each determined for each $X_n \times Y_n \times Z_n$ coordinate. According to other embodiments, the reservoir has a length of $X_n$, and a width of $Y_n$, and the productivity index and the total dynamic production index are each determined for each $X_n \times Y_n$ coordinate. The operations also include outputting to one or more electronic interfaces, positioned to display an online production analysis report responsive to determining the total dynamic productivity index for each coordinate. The online production analysis report includes an assessment of wells placement for the reservoir.

In another embodiment, the invention provides a computer-readable tangible memory medium having computer programs stored. The non-transitory computer-readable tangible medium having stored thereon one or more computer programs includes a set of instructions that when executed by one or more processors cause the one or more processors to perform operations. The operations include, for example, generating a reservoir analysis interface to display to a user thereof one or more online reservoir analysis reports, the reservoir analysis interface allowing an input of one or more reservoir metrics. The operations also include determining, by one or more processors, for a reservoir for each coordinate responsive to one or more of a plurality of reservoir metrics. The operations further include determining, by one or more processors, a total dynamic productivity index for each coordinate responsive to determining the productivity index for each coordinate. The operations further include determining placement of one or more wells for the reservoir responsive to determining the total dynamic productivity index for each coordinate. According to some embodiments, the reservoir has a length of $X_n$, a width of $Y_n$, and depth of $Z_n$, and the productivity index and the total dynamic production index are each determined for each $X_n \times Y_n \times Z_n$ coordinate. According to other embodiments, the reservoir has a length of $X_n$, and a width of $Y_n$, and the productivity index and the total dynamic production index are each determined for each $X_n \times Y_n$ coordinate. The operations also include outputting to one or more electronic interfaces, positioned to display an online production analysis report responsive to determining the total dynamic productivity index for each coordinate. The online production analysis report includes an assessment of wells placement for the reservoir.

In a further embodiment, the invention provides a computer implemented method to determine wells placement for a reservoir. The method including the steps of, for example, generating, in a computer process by one or more computer processors, a reservoir analysis interface to display to a user thereof one or more online reservoir analysis reports, the reservoir analysis interface allowing an input of one or more reservoir metrics. The computer-implemented method further comprising, determining, in a computer process by one or more computer processors, for a reservoir for each coordinate responsive to one or more of a plurality of reservoir metrics. The method further comprising determining, in a computer process by one or more computer processors, a total dynamic productivity index for each coordinate responsive to determining the productivity index for each coordinate. The method further comprising, determining, in a computer process by one or more computer processors, placement of one or more wells for the reservoir responsive to determining the total dynamic productivity index for each coordinate. According to some embodiments, the reservoir has a length of $X_n$, a width of $Y_n$, and depth of $Z_n$, and the productivity index and the total dynamic production index are each determined for each $X_n \times Y_n \times Z_n$ coordinate. According to other embodiments, the reservoir has a length of $X_n$, and a width of $Y_n$, and the productivity index and the total dynamic production index are each determined for each $X_n \times Y_n$ coordinate. The method further comprising, outputting, in a computer process by one or more computer processors, to one or more electronic interfaces, positioned to display an online production analysis report responsive to determining the total dynamic productivity index for each coordinate. The online production analysis report includes an assessment of wells placement for the reservoir.

BRIEF DESCRIPTION OF THE DRAWINGS

The application file contains at least one drawing executed in color. Copies of this patent application publication with color drawings will be provided by the Patent and Trademark Office upon request and payment of the necessary fee.

So that the manner in which the features and benefits of the invention, as well as others which will become apparent, may be understood in more detail, a more particular description of the embodiments of the invention may be had by reference to the embodiments thereof which are illustrated in the appended drawings, which form a part of this specification. It is also to be noted, however, that the drawings illustrate only various embodiments of the invention and are therefore not to be considered limiting of the invention's scope as it may include other effective embodiments as well.

FIG. 6 is a screenshot from reservoir analysis interface in accordance with one or more embodiments of the present invention.

FIG. 7 is a screenshot from reservoir analysis interface reservoir analysis report in accordance with one or more embodiments of the present invention.

DETAILED DESCRIPTION OF THE INVENTION

Figure 1:
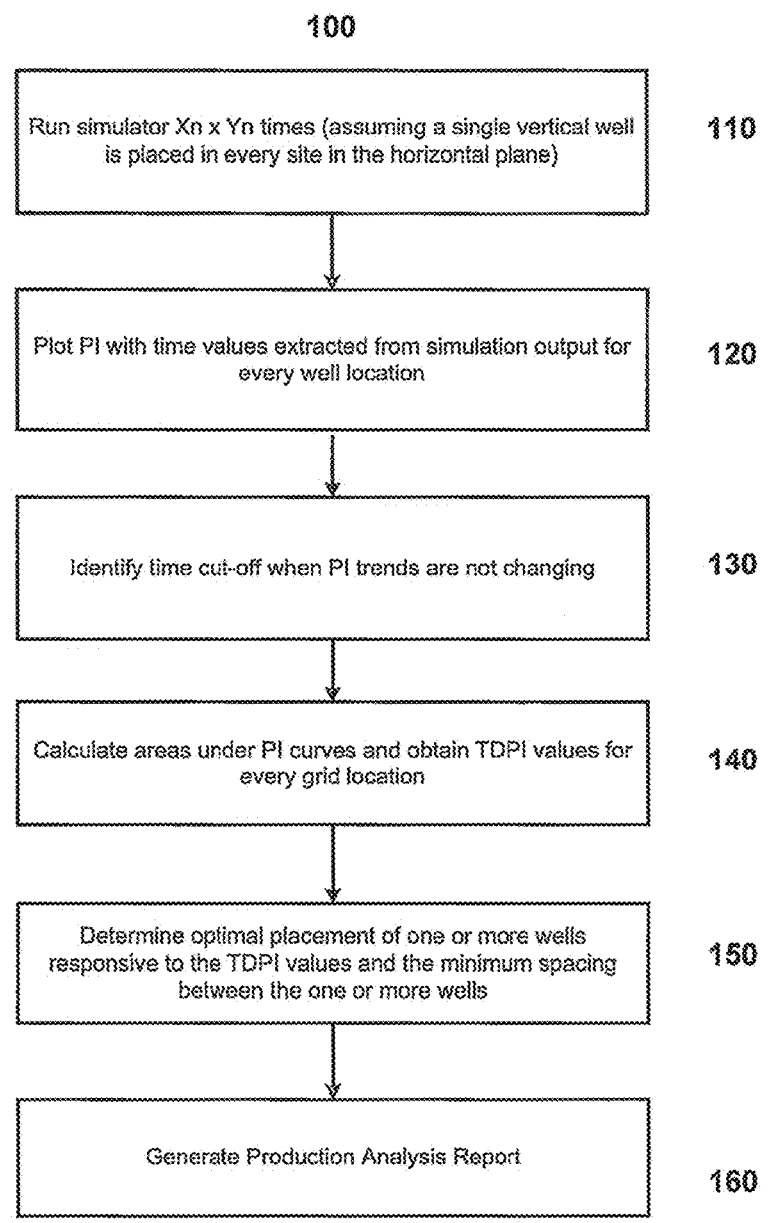
FIG. 1 is a flow chart showing the steps of an embodiment of the present invention.

The present invention will now be described more fully hereinafter with reference to the accompanying drawings, which illustrate various embodiments of the invention. This invention, however, may be embodied in many different forms and should not be construed as limited to the embodiments set forth herein. Rather, these embodiments are provided so that this disclosure will be thorough and complete, and will fully convey the scope of the invention to those skilled in the art. It is to be fully recognized that the different teachings of the various embodiments discussed below may be employed separately or in any suitable combination to produce desired results. The various characteristics mentioned above, as well as other features and characteristics described in more detail below, will be readily apparent to those skilled in the art upon reading the following detailed description of the various embodiments, and by referring to the accompanying drawings. In the drawings and description that follow, like parts are marked throughout the specification and drawings with the same reference numerals, respectively. The prime notation, if used, indicates similar elements in alternative embodiments. The drawings are not necessarily to scale. Certain features of the disclosure may be shown exaggerated in scale or in somewhat schematic form and some details of conventional elements may not be shown in the interest of clarity and conciseness.

Figure 2:
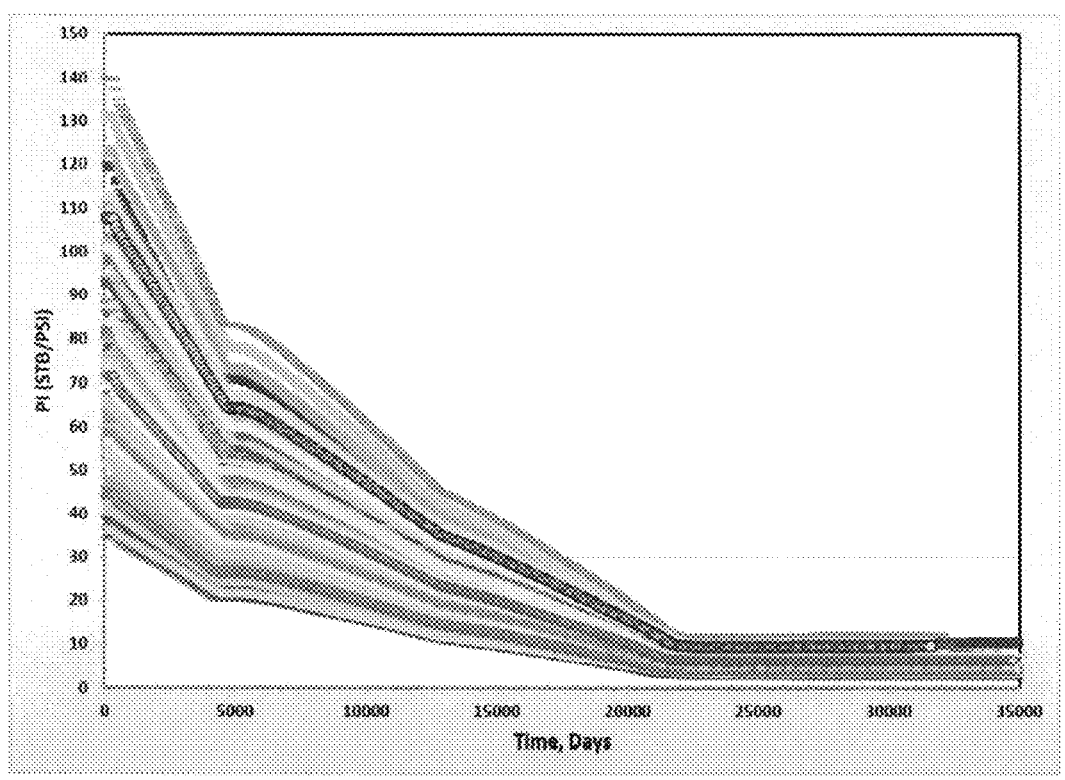
FIG. 2 illustrates productivity index values for every well in a reservoir over time according to an embodiment of the present invention.

As used herein, the term productivity index ("PI") is the ratio of production rate to pressure drawdown. As will be understood by those skilled in the art, PI is a dynamic parameter that combines preferred fluid phase production, which consists of several rock and fluid properties, with the pressure gradient driving the fluids towards production wells. From simulation models, the PI is found using known Peaceman's formulas for each fully penetrating vertical well during its productivity and can be used as a more influencing indicator for sweet spots identification. A person of skill in the art will understand how Peaceman's formulas can be used to calculate the PI for any grid shape, including squares and rectangles. According to an embodiment of the invention, the formula for PI is:

$$PI = q/(P_i - P_{wf})$$

wherein PI is the well index, q is the well production rate in barrels per day, $P_i$ is the average block pressure in pounds per square inch, and is the near wellbore flowing pressure in pounds per square inch. It is generally expected that PI decreases over time. Exemplary PI data are shown in FIG. 2. In FIG. 2, PI values were calculated over time for an exemplary reservoir having $X_{10} \times Y_{10}$ coordinates. Thus, FIG. 2 shows PI calculations for 100 distinct coordinates in an exemplary reservoir. As shown in FIG. 2, the PI values decreased over time.

In an embodiment of the invention, the invention provides systems, methods, and computer medium having computer programs stored thereon that facilitate selection of wells placement for a given reservoir. In an embodiment of the invention, the invention provides an online wells placement analysis system. The system includes one or more processors, an input/output unit adapted to be in communication with the one or more processors, one or more reservoir databases in communication with the one or more processors to store and associate a plurality of reservoir metrics with a plurality of coordinates, one or more electronic interfaces positioned to display an online reservoir analysis report, and non-transitory computer-readable medium in communication with the one or more processors and having one or more computer programs stored thereon including a set of instructions that when executed by one or more processors cause the one or more processors to perform operations. The operations include, for example, generating the reservoir analysis interface to display to a user thereof one or more online reservoir analysis reports, the reservoir analysis interface allowing an input of the plurality of reservoir metrics. The operations also include determining, by one or more processors, for a reservoir having a length of $X_n$, a width of $Y_n$, and depth of $Z_n$, a productivity index for each $X_n \times Y_n \times Z_n$ coordinate responsive to a plurality of production factors associated with the reservoir. The operations further include determining, by one or more processors, a total dynamic productivity index for each $X_n \times Y_n \times Z_n$ coordinate responsive to determining the productivity index for each $X_n \times Y_n \times Z_n$ coordinate. The operations also include outputting to one or more electronic interfaces, positioned to display an online production analysis report, the online production analysis report for a reservoir responsive to determining the productivity index for each $X_n \times Y_n \times Z_n$ coordinate and determining the total dynamic productivity index for each $X_n \times Y_n \times Z_n$ coordinate. The online production analysis report includes an assessment of wells placement for the reservoir.

In another embodiment of the invention, the invention provides systems, methods, and computer medium having computer programs stored thereon that facilitate selection of wells placement for a given reservoir. In an embodiment of the invention, the invention provides an online wells placement analysis system. The system includes one or more processors, an input/output unit adapted to be in communication with the one or more processors, one or more reservoir databases in communication with the one or more processors to store and associate a plurality of reservoir metrics with a plurality of coordinates, one or more electronic interfaces positioned to display an online reservoir analysis report, and non-transitory computer-readable medium positioned in communication with the one or more processors and having one or more computer programs stored thereon including a set of instructions that when executed by one or more processors cause the one or more processors to perform operations. The operations include, for example, generating the reservoir analysis interface to display to a user thereof one or more online reservoir analysis reports, the reservoir analysis interface allowing an input of the plurality of reservoir metrics. The operations also include determining, by one or more processors, for a reservoir having a length of $X_n$, and a width of $Y_n$, a productivity index for each $X_n \times Y_n$ coordinate responsive to a plurality of production factors associated with the reservoir. The operations further include determining, by one or more processors, a total dynamic productivity index for each $X_n \times Y_n$ coordinate responsive to determining the productivity index for each $X_n \times Y_n$ coordinate. The operations also include outputting to one or more electronic interfaces, positioned to display an online production analysis report, the online production analysis report for a reservoir responsive to determining the productivity index for each $X_n \times Y_n$ coordinate and determining the total dynamic productivity index for each $X_n \times Y_n$ coordinate. The online production analysis report includes an assessment of wells placement for the reservoir.

In another embodiment, the invention provides a computer-readable tangible memory medium having computer programs stored. The non-transitory computer-readable tangible medium having stored thereon one or more computer programs includes a set of instructions that when executed by one or more processors cause the one or more processors to perform operations. The operations include determining, by one or more processors, for a reservoir having a length of $X_n$, a width of $Y_n$, and depth of $Z_n$, a productivity index for each $X_n \times Y_n \times Z_n$ coordinate responsive to a plurality of production factors associated with the reservoir. The operations also include determining, by one or more processors, a total dynamic productivity index for each $X_n \times Y_n \times Z_n$ coordinate responsive to the productivity index for each $X_n \times Y_n \times Z_n$ coordinate. The operations further include outputting to one or more electronic interfaces, positioned to display an online production analysis report, the online production analysis report for a reservoir responsive to determining the productivity index for each $X_n \times Y_n \times Z_n$ coordinate and determining the total dynamic productivity index for each $X_n \times Y_n \times Z_n$ coordinate. The online production analysis report includes an assessment of wells placement for the reservoir.

In another embodiment, the invention provides a computer-readable tangible memory medium having computer programs stored thereon. The non-transitory computer-readable tangible medium having stored thereon one or more computer programs includes a set of instructions that when executed by one or more processors cause the one or more processors to perform operations. The operations include determining, by one or more processors, for a reservoir having a length of $X_n$, and a width of $Y_n$, a productivity index for each $X_n \times Y_n$ coordinate responsive to a plurality of production factors associated with the reservoir. The operations also include determining, by one or more processors, a total dynamic productivity index for each $X_n \times Y_n$ coordinate responsive to the determining the productivity index for each $X_n \times Y_n$ coordinate. The operations also include outputting to one or more electronic interfaces, positioned to display an online production analysis report, the online production analysis report for a reservoir responsive to determining the productivity index for each $X_n \times Y_n$ coordinate and determining the total dynamic productivity index for each $X_n \times Y_n$ coordinate. The online production analysis report includes an assessment of wells placement for the reservoir.

In a further embodiment, the invention provides a computer implemented method to determine wells placement for a reservoir. The method includes determining, by one or more processors, for a reservoir having a length of $X_n$, a width of $Y_n$, and depth of $Z_n$, a productivity index for each $X_n \times Y_n \times Z_n$ coordinate responsive to a plurality of production factors associated with the reservoir. The method also includes determining, by one or more processors, a total dynamic productivity index for each $X_n \times Y_n \times Z_n$ coordinate responsive to determining the productivity index for each $X_n \times Y_n \times Z_n$ coordinate. The method further includes outputting to one or more electronic interfaces, positioned to display an online production analysis report, the online production analysis report for a reservoir responsive to determining the productivity index for each $X_n \times Y_n \times Z_n$ coordinate and determining the total dynamic productivity index for each $X_n \times Y_n \times Z_n$ coordinate. The online production analysis report includes an assessment of wells placement for the reservoir.

In another embodiment, the invention provides a computer implemented method to determine wells placement for a reservoir. The method includes determining, by one or more processors, for a reservoir having a length of $X_n$, and a width of $Y_n$, a productivity index for each $X_n \times Y_n$ coordinate responsive to a plurality of production factors associated with the reservoir. The method also includes determining, by one or more processors, a total dynamic productivity index for each $X_n \times Y_n$ coordinate responsive to the determining the productivity index for each $X_n \times Y_n$ coordinate. The method further includes outputting to one or more electronic interfaces, positioned to display an online production analysis report, the online production analysis report for a reservoir responsive to determining the productivity index for each $X_n \times Y_n$ coordinate and determining the total dynamic productivity index for each $X_n \times Y_n$ coordinate. The online production analysis report includes an assessment of wells placement for the reservoir.

According to an embodiment of the invention, the invention provides a method for optimizing the placement of wells in a reservoir. As shown at 100 in FIG. 1, embodiments of the invention includes generating, by one or more processors of a computer, a grid pattern of a reservoir having a length of $X_n$ and a width of $Y_n$. To simulate a reservoir using the $X_n \times Y_n$ coordinate grid pattern, a model is simulated 110 assuming a well in each $X_n \times Y_n$ coordinate. In some embodiments, the model simulating a well in each coordinate assumes no other wells in the reservoir at the time of simulation (i.e. the model assumes the only well is in the $X_n \times Y_n$ coordinate being analyzed at any given point in time). The productivity index values for every time step for every well location are then plotted to produce a curve for each well. The areas under every resulting curve are then calculated using the trapezoidal rule to determine the TDPI value. The TDPI value can be determined for each $X_n \times Y_n$ coordinate using this simulation method. From this simulation, a productivity index is extracted 120 for each $X_n \times Y_n$ coordinate. This process can be stopped at any point of time selected by the user for every given $X_n \times Y_n$ coordinate. Certain embodiments of the invention include, for example, identifying 130 the time cut-off when the PI trends are not changing. The area under productivity index curve is then calculated 140 to determine a total dynamic productivity index. The TDPI values signify the amount of hydrocarbon volume that may be drained from a well drilled at a certain spot when the reservoir pressure is decreased by one unit with no time restriction. In further embodiments, the process further includes applying 150 a wells placement optimization algorithm using the total dynamic productivity index to determine 160 optimum placement of wells for a reservoir and to generate the production analysis report. The number of wells to be placed is oftentimes limited by budget, thus optimum selection of wells placement can assist in meeting economic objectives. The wells placement optimization algorithm provides, for example, the best combination of wells that accommodate constraints (e.g., minimum spacing between wells and maximum number of wells to be placed). The TDPI values are the input matrices for the optimization formulations and are used to place wells while accommodating the constraints. As will be understood by those skilled in the art, the wells placement optimization algorithm can be implemented using one or more computer program modules.

In some embodiments, the wells placement optimization algorithm uses the following formulas for determining optimum wells placements.

$$\text{maximize} \sum_{(i,j) \in I \times J} p_{(i,j)} x_{(i,j)} \quad \text{Equation 1}$$

$$\text{subject to } x_{(i_1, j_1)} + x_{(i_1, j_2)} \leq 1, \quad \text{Equation 2}$$

$$\begin{cases} (i_1, j_1), (i_2, j_2) \in I \times J \\ \sqrt{(i_1 - i_2)^2 + (j_1 - j_2)^2} < D \end{cases}$$

$$\sum_{(i,j) \in I \times J} x_{(i,j)} \leq N \quad \text{Equation 3}$$

$$x_{(i,j)} \in \{0, 1\} \quad (i, j) \in I \times J$$

where a variable $x_{(i,j)}$ represents the location (i,j) in the hydrocarbon reservoir grid, and is equal to 1 if the location is chosen, or 0 otherwise; and $N_{(i,j)}$ represents the TDPI indicator value at each cell in the two-dimensional reservoir. The optimum placement is subject to the constraints shown above, including minimum spacing between wells in the category of node packing sets (Equation 2) and the maximum number of wells cardinality constraint (Equation 3).

In Equation 2, the user defines the minimum spacing that should be accommodated between the wells and he enters the value of D (i.e. the minimum number of cells). This is known by those skilled in the art as mode packing sets constraint. In Equation 3, the user also defines the maximum number of wells to be optimized N. This constraint will identify coordinates (i.e., the i and j location) of the final set of optimum wells and adds their corresponding TDPI values to the objective function to be maximized. This constraint is known as the cardinality constraint. Optimization computations can be performed using any known systems, such as the Gurobu 5.5.0 commercial solver.

In further embodiments, each $X_n \times Y_n$ cell is in the shape of a square. In further embodiments, each $X_n \times Y_n$ cell is in the shape of a rectangle. In general, the reservoir modeling systems described herein assume that the grid is rectangular or square in shape. One of skill in the art, however, will understand that the modeling systems can also include an assessment of nonsquare or nonrectangular cells, as methods of calculating the productivity index for any cell shape are known in the art. In further embodiments, the modeled wells placement for each coordinate is the geometric center of each coordinate.

Two dimensional modeling is useful in assessing vertical displacement processes, such as a case of flank water injection or crestal gas injection where gravity has a significant impact on displacement efficiency. Two dimensional modeling is also useful in reservoirs where vertical heterogeneities are not significant to fluid flow and horizontal flow patterns dictate reservoir performance. In reservoirs where gravity effects are not significant, two dimensional models also can be used to investigate solution gas drive reservoirs.

In some embodiments of the invention, the reservoir is three-dimensional and has a depth of $Z_n$. In some embodiments of the invention, the cell in the three-dimensional model is in the shape of a cube. However, the three-dimensional model need not always have cells in a cube shape. As will be understood by those skilled in the art, in such an embodiment, to simulate each $X_n \times Y_n \times Z_n$ coordinate of the grid pattern, the model assumes a well in each $X_n \times Y_n \times Z_n$ coordinate. From this simulation, a productivity index is extracted for each $X_n \times Y_n \times Z_n$ coordinate. According to an embodiment, this process is repeated until a point in time in which the productivity index remains about the same for a given $X_n \times Y_n \times Z_n$ coordinate. According to another embodiment, this process can be stopped at any point of time selected by the user for every coordinate. A productivity index curve is then created to the point in time in which the productivity index remains about the same. The productivity index is considered to remain about the same in three-dimensional models when the trends in the productivity index curves from an entire layer of cells is about the same. The area under productivity index curve is then calculated to determine a total dynamic productivity index. In some embodiments, the model simulating a well in each $X_n \times Y_n \times Z_n$ coordinate assumes no other wells in the reservoir at the time of simulation (i.e. the model assumes the only well is in the $X_n \times Y_n \times Z_n$ being analyzed at any given point in time). In such three dimensional modeling systems, the simulated well is placed in each "top layer" at every cell. The simulated well is then penetrated through the entire column of layers below that cell to the deepest layer. The model has $n^3$ cells, but $n^2$ wells in this simulation, based on the assumption that a single well will penetrate through the layers. The productivity index values at every time step for each well location are extracted, with a productivity index being reported for each layer. The productivity index values are then plotted versus time for each cell from every well location. For example, in a 10×10×5 reservoir model, there are five productivity index curves for every well location (i.e. 500 curves plotted to compute 500 TDPI values). The area under every resulting curve are then calculated using the trapezoidal rule to determine the TDPI value. The TDPI value is determined for each $X_n \times Y_n \times Z_n$ coordinate using this simulation method.

In some embodiments, a given coordinate will be a nonproductive coordinate, which will result in no productivity index values reported for such a coordinate. The other coordinates having a productivity index value will have TDPI values computed, but the overall number of TDPI values in such an embodiment will be less than $X_n \times Y_n$ or $X_n \times Y_n \times Z_n$, as some of these coordinates will be nonproductive coordinates with no productivity index values. For example, in a three dimensional model, there may be portions that do not have a productivity index value between portions that do have a productivity index value (e.g., a reservoir having a nonproductive middle layer and productive upper and lower layers). In such an embodiment, the number of wells is still $X_n \times Y_n$, but the number of TDPI values will be lower than a model having all productive coordinates.

Figure 3A:
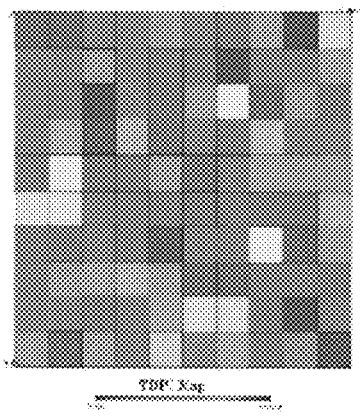
FIG. 3A illustrates a total dynamic productivity ("TDPI") map at 180 days for according to an embodiment of the present invention.
Figure 3B:
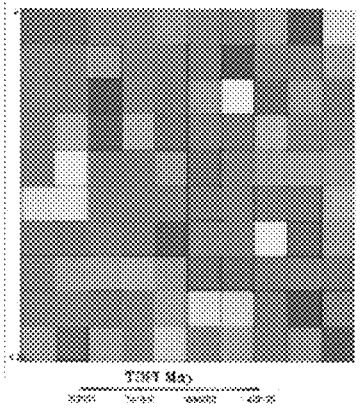
FIG. 3B illustrates a TDPI map at 38,160 days, for the same reservoir as FIG. 3A, for according to an embodiment of the present invention.

In an embodiment of the invention, the method includes placing a vertical well in different cell locations $X_n \times Y_n$ times. As will be understood by those skilled in the art, the PI can be calculated for every well as many times as is required until the PI remains about the same. After relating PI calculated values with time, as shown in FIG. 2, the areas under the curve are determined and the results can be denoted as TDPI indicators for a plurality of well locations, which then can be translated into map form. TDPI indicators signify the amount of hydrocarbon volume that may be drained from a well drilled at a certain spot when the reservoir pressure is decreased by one unit with no time limitation. FIGS. 3A and 3B show the TDPI maps for the exemplary reservoir. FIG. 3A shows the TDPI map for the exemplary reservoir at 180 days. FIG. 3B shows the TDPI map for the exemplary reservoir at 38,160 days.

In further embodiments, the simulation includes a fixed, or constant, flow rate. In a two dimensional model, the fixed flow rate can be the same for every well in every coordinate. In a three-dimensional model, the fixed flow rate is applied for every coordinate (e.g. for every well and every cell the well penetrates below it). Fixing the flow rate at each coordinate will reveal the contrast in rock and fluid properties throughout a reservoir. Other parameters can be specified in the simulation, such as maximum water cut, maximum oil gas ratio, and minimum bottom hole pressure.

As will be understood by those skilled in the art, the established TDPI indicators can be used as an input matrix for wells placement optimization algorithms, to compare qualities for different reservoirs, and to assist in identifying poor reservoir contributing regions. In addition, TDPI maps can be used as a tool to facilitate reservoir management decisions. The TDPI indicators are based on dynamic parameters that implicitly combine fluid and rock properties with pressure and saturation as they change with time. This combination utilizes static (e.g., geometrical area) and dynamic (e.g., viscosity) reservoir parameters in the process of identifying sweet spots. The analysis also takes into account dynamic characteristics such as permeability because permeability changes over time and with different properties. For instance, permeability changes with relative saturation when different fluid phases are present. The depositional environment at which the rock is formed is responsible for the textural character of the rock which impact permeability since different grain arrangement, sorting, and sizes influence the flow of fluid in a porous medium. Similarly, viscosity is a fluid property that changes with pressure in typical reservoirs and it also contributes to the production flow rate. Thus, static and dynamic properties are included in the permeability which contributes to the production flow rate used to find the PI. TDPI indicators can be found with reduced sensitivity as to time. This results in minimum computational expense to generate the TDPI map since it can be created after a small amount of time has elapsed and provides the same informational quality as if the TDPI map was created after a long production time. Additionally, the new TDPI maps can be generated quickly and with little expense once abrupt changes have been recorded in the dynamicity of any reservoir. This also allows assessment of fracturing sites by assessing TDPI maps before and after fracturing is simulated on tight zones in reservoir models.

Embodiments of the present invention will allow for assessment of multiple geological models, thus enhancing the overall analysis and reducing the window of uncertainty for a given reservoir. For instance, the simulation can be performed using different geological realizations for a given reservoir. Each resulting TDPI map for each geological realization may have different values for a given coordinate. The review of TDPI maps for each geological realization may highlight diversity between the geological realizations and narrow the window of uncertainty for the investigated reservoir. Review of the results can provide a best case, worst case, and middle of the road assessment based on all of the simulations provided. Additionally, if all of the TDPI maps identify the same coordinates as being of high value, the likelihood of success in a given region in a reservoir may be enhanced. Conversely, if all of the TDPI maps identify the same coordinates as being of low value, this may indicate a region of low interest or low potential.

Figure 4:
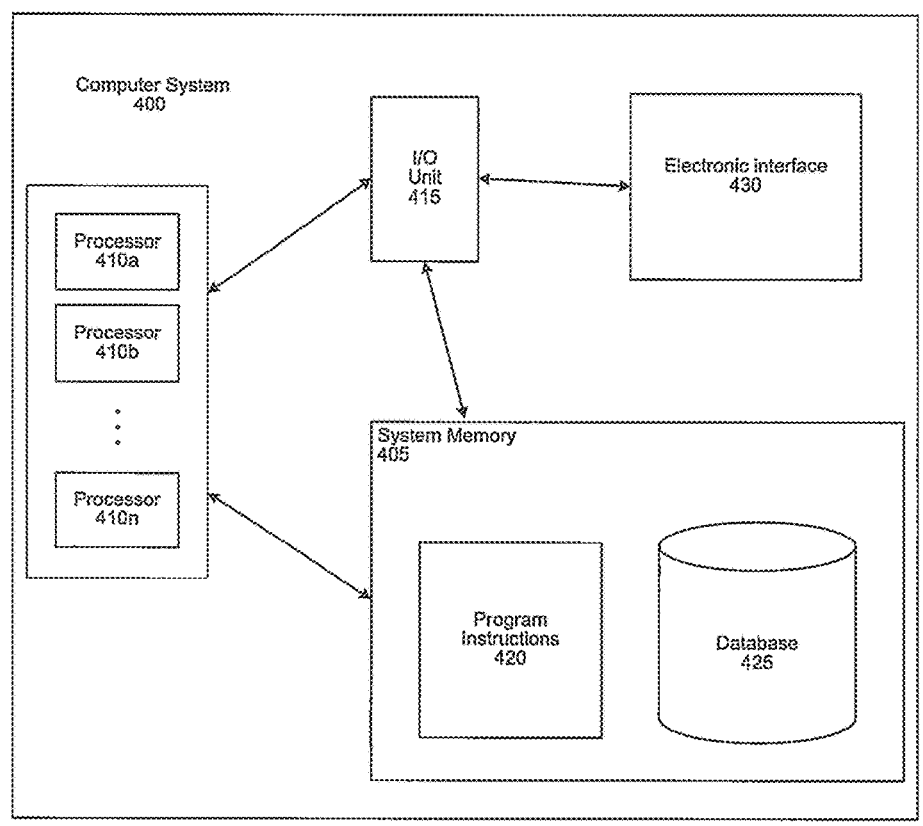
FIG. 4 is a block diagram that illustrates an exemplary computer system in accordance with one or more embodiments of the present invention.

Exemplary embodiments of the present invention further include a wells placement analysis system, as illustrated by using an example in FIG. 4. An online system indicates that the system is accessible to a user over a network and may encompass accessibility through data networks, including but not limited to the internet, intranets, private networks or dedicated channels. This online wells placement analysis system 400 includes one or more processors 410a-410n, an input/output unit 415 adapted to be in communication with the one or more processors 410a-410n, one or more reservoir databases 425 in communication with the one or more processors to store and associate a plurality of reservoir metric estimates with a plurality of coordinates, one or more electronic interfaces 430 positioned to display an online production analysis report and defining one or more reservoir analysis interfaces, and non-transitory computer-readable medium 405. The non-transitory computer-readable medium is positioned in communication with the one or more processors and has one or more computer programs stored thereon including a set of instructions 420. This set of instructions when executed by one or more processors cause the one or more processors to perform operations of generating the reservoir analysis interface to display to a user thereof one or more online reservoir analysis reports, determining a productivity index and total dynamic productivity index for each coordinate, generating a grid pattern of the reservoir using the PI with time values extracted for each coordinate, and outputting to the one or more electronic interfaces 430 the reservoir analysis report for the reservoir responsive to determining the total dynamic productivity index. The reservoir analysis interface allows an input of a plurality of reservoir metric estimates associated with a coordinate. The reservoir analysis report includes recommendations regarding optimal wells placement for a reservoir. Various portions of systems and methods described herein, may include or be executed on one or more computer systems similar to system 400.

Figure 5:
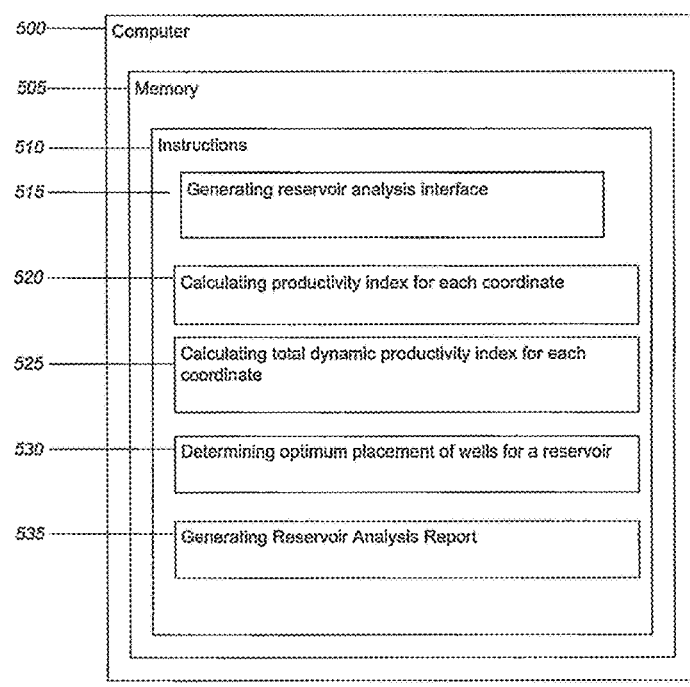
FIG. 5 is a schematic block diagram of a system to determine optimum wells placement for a reservoir according to an embodiment of the invention.

As illustrated by using an example in FIG. 5, the methods of determining an optimum placement of wells in a reservoir can be driven by a computer 500 that can include, according to various exemplary embodiments of the present invention, at least a memory 505, a processor, and an input/output device. As used herein, the processor can include, for example, one or more microprocessors, microcontrollers, and other analog or digital circuit components configured to perform the functions described herein. The processor is the "brain" of the respective computer, and as such, can execute one or more computer program product or products. For example, the processor in the reservoir analysis system can execute a computer program product or instructions 510 stored in memory 505 of the computer 500, including, for example, a product to facilitate the generation of an reservoir analysis report. Such a product can include a set of instructions to display 515 a reservoir analysis interface at a remote computer that would allow a user to input reservoir metrics of a selected reservoir. Such a product can also include instructions to calculate 520 productivity indexes for each coordinate responsive to these reservoir metrics, and calculate 525 the total dynamic productivity index to determine 530 an optimal wells placement for a reservoir. In an embodiment, one can also generate 535 reservoir analysis report.

The processor can be any commercially available terminal processor, or plurality of terminal processors, adapted for use in or with the computer 500. A processor may be any suitable processor capable of executing/performing instructions. A processor may include a central processing unit (CPU) that carries out program instructions to perform the basic arithmetical, logical, and input/output operations of the computer 500. A processor may include code (e.g., processor firmware, a protocol stack, a database management system, an operating system, or a combination thereof) that creates an execution environment for program instructions. A processor may include a programmable processor. A processor may include general and/or special purpose microprocessors. The processor can be, for example, the Intel® Xeon® multicore terminal processors, Intel® micro-architecture Nehalem, and AMD Opteron™ multicore terminal processors, Intel® Core® multicore processors, Intel® Core iSeries® multicore processors, and other processors with single or multiple cores as is known and understood by those skilled in the art. The processor can be operated by operating system software installed on memory, such as Windows Vista, Windows NT, Windows XP, UNIX or UNIX-like family of systems, including BSD and GNU/Linux, and Mac OS X. The processor can also be, for example the TI OMAP 3430, Arm Cortex A8, Samsung S5PC100, or Apple A4. The operating system for the processor can further be, for example, the Symbian OS, Apple iOS, Blackberry OS, Android, Microsoft Windows CE, Microsoft Phone 7, or PalmOS. Computer system 400 may be a uni-processor system including one processor (e.g., processor 410a), or a multi-processor system including any number of suitable processors (e.g., 410a-410n). Multiple processors may be employed to provide for parallel and/or sequential execution of one or more portions of the techniques described herein. Processes and logic flows described herein may be performed by one or more programmable processors executing one or more computer programs to perform functions by operating on input data and generating corresponding output. Processes and logic flows described herein may be performed by, and apparatus can also be implemented as, special purpose logic circuitry, e.g., an FPGA (field programmable gate array) or an ASIC (application specific integrated circuit). Computer system 400 may include a computer system employing a plurality of computer systems (e.g., distributed computer systems) to implement various processing functions.

A computer 500 as illustrated in the example described in FIG. 5 can further include a non-transitory memory or more than one non-transitory memories (referred to as memory 505 herein). Memory 505 can be configured, for example, to store data, including computer program product or products, which include instructions for execution on the processor. Memory can include, for example, both non-volatile memory, e.g., hard disks, flash memory, optical disks, and the like, and volatile memory, e.g., SRAM, DRAM, and SDRAM as required to support embodiments of the instant invention. As one skilled in the art will appreciate, though the memory 505 is depicted on, e.g., a motherboard, of the computer 500, the memory 505 can also be a separate component or device, e.g., flash memory, connected to the computer 500 through an input/output unit or a transceiver. As one skilled in the art will understand, the program product or products, along with one or more databases, data libraries, data tables, data fields, or other data records can be stored either in memory 505 or in separate memory (also non-transitory), for example, associated with a storage medium such as a database (not pictured) locally accessible to the computer 500, positioned in communication with the computer 500 through the I/O device. Non-transitory memory further can include drivers, modules, libraries, or engines allowing the reservoir analysis computer to function as a dedicated software/hardware system (i.e., a software service running on a dedicated computer) such as an application server, web server, database server, file server, home server, standalone server. For example, non-transitory memory can include a server-side markup language processor (e.g., a PHP processor) to interpret server-side markup language and generate dynamic web content (e.g., a web page document) to serve to client devices over a communications network.

Exemplary embodiments of the present invention include an reservoir analysis interface. An reservoir analysis interface is, for example, a graphical user interface facilitating the acquisition of data from the user to determine the impact of reservoir metrics on wells placement optimization. This electronic interface can also display the reservoir analysis report. The graphical user interface device can include, for example, a CRT monitor, a LCD monitor, a LED monitor, a plasma monitor, an OLED screen, a television, a DLP monitor, a video projection, a three-dimensional projection, a holograph, a touch screen, or any other type of user interface which allows a user to interact with one of the plurality of remote computers using images as is known and understood by those skilled in the art.

Figure 6:
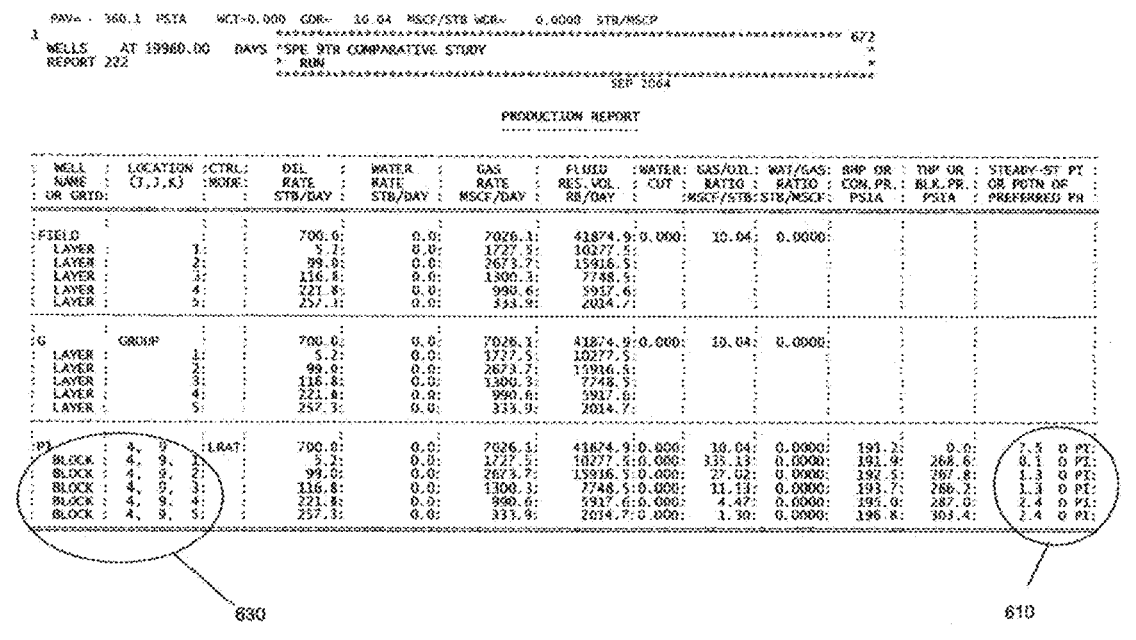
Figure 7:
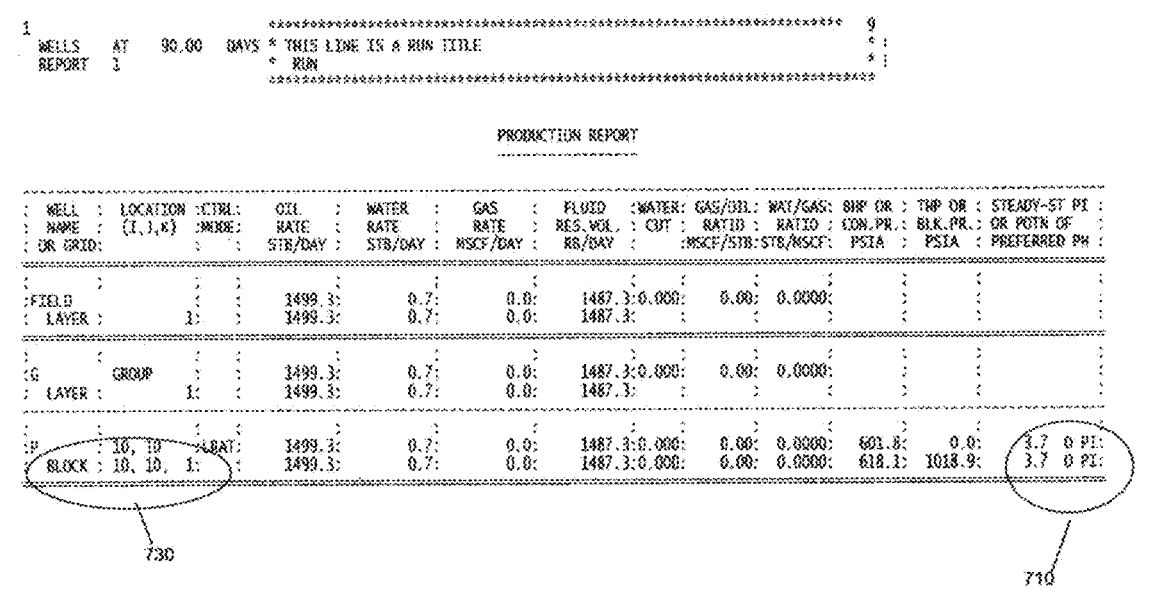

An example of a screenshot from reservoir analysis interface is shown in FIGS. 6 and 7. In FIG. 6, screenshot 600 shows a screenshot that a user would see on an interface while running a simulation. The screenshot shows the computed PI value 610 at a given timestamp for a given well in a given coordinate 630 for a three-dimensional model. Note that the screenshot 600 shows a computed PI 610 for each coordinate. A similar screenshot 700 is shown in FIG. 7, showing computed PI values 710, at a given timestamp, for a given well in coordinates 730 for a two-dimensional model.

According to various exemplary embodiments of the present invention, the reservoir database can be any database structure as is known and understood by those skilled in the art. The databases discussed herein, including the reservoir database, can be, for example, any sort of organized collection of data in digital form. Databases, including the reservoir database, can include the database structure as well as the computer programs that provide database services to other computer programs or computers, as defined by the client-server model, and any computer dedicated to running such computer programs (i.e., a database server). An exemplary database model, for example, is Microsoft SQL Server 2008 R2. Databases can include a database management system (DBMS) consisting of software that operates the database, provides storage, access, security, backup and other facilities. DBMS can support multiple query languages, including, for example, SQL, XQuery, OQL, LINQ, JDOQL, and JPAQL. Databases can implement any known database model or database models, including, for example, a relational model, a hierarchical model, a network model, or an object-oriented model. The DBMS can include Data Definition Language (DDL) for defining the structure of the database, Data Control Language (DCL) for defining security/access controls, and Data Manipulation Language (DML) for querying and updating data. The DBMS can further include interface drivers, which are code libraries that provide methods to prepare statements, execute statements, fetch results, etc. Examples of interface drivers include ODBC, JDBC, MySQL/PHP, FireBird/Python. DBMS can further include a SQL engine to interpret and execute the DDL, DCL, and DML statements, which includes a compiler, optimizer, and executor. DBMS can further include a transaction engine to ensure that multiple SQL statements either succeed or fail as a group, according to application dictates. DBMS can further include a relational engine to implement relational objects such as Table, Index, and Referential integrity constraints. DBMS can further include a storage engine to store and retrieve data from secondary storage, as well as managing transaction commit and rollback, backup and recovery, etc.

Data stored in fields of the databases can be updated as needed, for example, by a user with administrative access to the database to add new data to the libraries in the database as they become supported. It will be appreciated by those having skill in the art that data described herein as being stored in the databases can also be stored or maintained in non-transitory memory and accessed among subroutines, functions, modules, objects, program products, or processes, for example, according to objects and/or variables of such subroutines, functions, modules, objects, program products or processes. Any of the fields of the records, tables, libraries, and so on of the database can be multi-dimensional structures resembling an array or matrix and can include values or references to other fields, records, tables, or libraries. Any of the foregoing fields can contain actual values or a link, a join, a reference, or a pointer to other local or remote sources for such values.

The reservoir database can be, for example, a single database, multiple databases, or a virtual database, including data from multiple sources, for example, servers on the World Wide Web.

According to various exemplary embodiments of the present invention, the reservoir analysis report computer can be a server and can include, for example, any type of mainframe, physical appliance, or personal computing device such as rack server, mainframe, desktop computer, or laptop computer, dedicated in whole or in part to running one or more services to serve the needs or requests of client programs which may or may not be running on the same computer. The reservoir analysis computer can be, for example, a dedicated software/hardware system (i.e., a software service running on a dedicated computer) such as an application server, web server, database server, file server, home server, or standalone server. As one skilled in the art will appreciate, though the reservoir analysis computer can interface with a separate web server, application server, or network server to access the functionality of the reservoir analysis computer, for example, through a communications network or other network options, and such a configuration may be preferred for certain large-scale implementations.

In order to provide the ability to host multiple web and database servers in a web farm, the reservoir analysis system can include a local traffic manager (LTM), such as the Big-IP LTM from F5, to serve as a web-platform core. The LTM can deliver high availability, improved performance, application security, and access control services to applications served by the reservoir analysis server. The LTM removes single points of failure and virtualizes the network and applications using industry-leading L7 intelligence. The LTM can include, for example, rich static and dynamic load balancing methods, dynamic ratio, least connections, and observed load balancing. The LTM can further ensure always-on status, provide scalability, and provide management ease.

As one skilled in the art will understand, the program product or products, along with one or more databases, data libraries, data tables, data fields, or other data records can be stored either in non-transitory memory or in separate memory (also non-transitory), for example, associated with a storage medium such as database, positioned in communication with the reservoir analysis computer through the I/O devices. Non-transitory memory can further include drivers, modules, libraries, or engines allowing the reservoir analysis computer to function as a dedicated software/hardware system (i.e., a software service running on a dedicated computer) such as an application server, web server, database server, file server, home server, standalone server.

As one skilled in the art will appreciate, both memory and the processor can also include, for example, components (e.g., drivers, libraries, and supporting hardware connections) that allow the computers to be connected to a display peripheral device and an input peripheral device that allow a user direct access to the processor and the memory. The display peripheral device can be, for example, a computer monitor, which may also be known in the art as a display or a visual display unit. The display peripheral device also can include, for example, a display device, which in modern monitors is typically a thin film transistor liquid crystal display (TFT-LCD) thin panel, while older monitors use a cathode ray tube. The display peripheral device can include the display device, the circuitry, and the physical enclosure. The display peripheral device can be used, in connection with interactive client-side interface capabilities residing in memory, to display interactive interfaces to a user at the remote computer or the buyer computer, such as the reservoir analysis interface and the payment graphical user interface. As discussed in greater detail above, the display peripheral device can also be a PDA and can function, at the same time, as a display peripheral device, an input peripheral device, and an output peripheral device.

The input peripheral device can be, for example, a computer keyboard, computer mouse, a touch screen (such as a touch screen device comprising display peripheral device), a pen device, character recognition device, voice recognition device, or a similar input device that will be known to those having skill in the art that allows the user at the remote computer or the buyer computer, through mechanical, electrical, or mechanical and electrical means to send discrete or continuous signals to the processor. A status or other output associated with input peripheral device can be displayed at the display peripheral device, such as, for example, mouse pointer or a keyboard prompt. The output of input peripheral device can be received by the processor, for example, as a selection or a command associated with an interactive client-side interface, such as the reservoir analysis interface and the payment graphical user interface. An interactive client-side interface may be configured, for example, to receive a selection or a command from the input peripheral and, responsive thereto, transmit data, including content input by the user at the input peripheral device, as well as other content as directed by the client-side interface, to other servers or systems through the input/output unit.

It is important to note that while embodiments of the present invention have been described in the context of a fully functional system, those skilled in the art will appreciate that the mechanism of at least portions of the present invention or aspects thereof are capable of being distributed in the form of a computer-readable program product stored in a tangible computer medium and a computer-readable medium of instructions in a variety of forms for execution on a processor, processors, or the like, and that the present invention applies equally regardless of the particular type of signal-bearing media used to actually carry out the distribution. Note, the computer readable program product can be in the form of microcode, programs, routines, and symbolic languages that provide a specific set or sets of ordered operations that control the functioning of the hardware and direct its operation, as known and understood by those skilled in the art. Examples of computer readable media include, but are not limited to: nonvolatile hard-coded type media such as read only memories (ROMs), CD-ROMs, and DVD-ROMs, or erasable, electrically programmable read only memories (EEPROMs), recordable type media such as floppy disks, hard disk drives, CD-R/RWs, DVD-RAMs, DVD-R/RWs, DVD+R/RWs, flash drives, memory sticks, HD-DVDs, mini disks, laser disks, Blu-ray disks, and other newer types of memories, and transmission type media such as digital and analog communication links.

As will be understood by those skilled in the art, screening reservoirs for enhanced oil recovery ("EOR") can be conducted efficiently utilizing TDPI maps generated after considering several EOR methods in simulation.

Although embodiments of the present invention has been described in detail, it should be understood that various changes, substitutions, and alterations can be made hereupon without departing from the principle and scope of the invention. Accordingly, the scope of the present invention should be determined by the following claims and their appropriate legal equivalents.

Moreover, the foregoing has broadly outlined certain objectives, features, and technical advantages of the present invention and a detailed description of the invention so that embodiments of the invention may be better understood in light of features and advantages of the invention as described herein, which form the subject of certain claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages are better understood from the description above when considered in connection with the accompanying figures. It is to be expressly understood, however, that such description and figures are provided for the purpose of illustration and description only and are not intended as a definition of the limits of the present invention. It will be apparent to those skilled in the art that various modifications and changes can be made within the spirit and scope of the invention as described in the foregoing specification.

That which is claimed is:

1. A wells placement analysis system, the system comprising:
   one or more processors;
   one or more input/output units adapted to be in communication with the one or more processors;
   one or more databases adapted to store and associate a plurality of reservoir metrics with a plurality of coordinates to thereby define one or more reservoir databases, the one or more reservoir databases in communication with the one or more processors;
   one or more non-transitory computer-readable mediums positioned in communication with the one or more processors and having one or more computer programs stored thereon including a set of instructions that when executed by one or more processors cause the one or more processors to perform operations of:
   determining, by one or more processors, for a reservoir having a length of $X_n$, width of $Y_n$, and depth of $Z_n$, a productivity index for each $X_n \times Y_n \times Z_n$ coordinate using one or more of the plurality of reservoir metrics associated with the reservoir;
   determining, by one or more processors, a total dynamic productivity index for each $X_n \times Y_n \times Z_n$ coordinate responsive to determining the productivity index for each $X_n \times Y_n \times Z_n$ coordinate; and
   generating, by one or more processors, a production analysis report for the reservoir responsive to determining the total dynamic productivity index for each $X_n \times Y_n \times Z_n$ coordinate, the production analysis report including an assessment of well placement for the reservoir;
   determining, by one or more processors, placement of one or more wells for the reservoir responsive to the total dynamic productivity index for each $X_n \times Y_n \times Z_n$ coordinate and minimum spacing between the one or more wells; and
   placing one or more wells in the reservoir based on the total dynamic productivity index for each $X_n \times Y_n \times Z_n$ coordinate and minimum spacing between the one or more wells.

2. The system of claim 1, wherein the productivity index is calculated using the formula:

$$PI = q/(P_i - P_{wf})$$

wherein PI is the productivity index, q is a well production rate in barrels per day, $P_i$ is an average block pressure in pounds per square inch, and $P_{wf}$ is a near wellbore flowing pressure in pounds per square inch.

3. The system of claim 1, wherein the instructions further cause the one or more processors to perform operations of:
   generating, by one or more processors, a well placement map using one or more total dynamic productivity index indicators.

4. A wells placement analysis system, the system comprising:
   one or more processors;
   one or more input/output units adapted to be in communication with the one or more processors;

one or more databases adapted to store and associate a plurality of reservoir metrics with a plurality of coordinates to thereby define one or more reservoir databases, the one or more reservoir databases in communication with the one or more processors;

one or more non-transitory computer-readable mediums positioned in communication with the one or more processors and having one or more computer programs stored thereon including a set of instructions that when executed by one or more processors cause the one or more processors to perform operations of:

determining, by one or more processors, for a reservoir having a length of $X_n$, width of $Y_n$, and depth of $Z_n$, a productivity index for each $X_n \times Y_n \times Z_n$ coordinate using one or more of the plurality of reservoir metrics associated with the reservoir;

generating, by one or more processors, a grid pattern of the reservoir using the productivity index with time values extracted for each $X_n \times Y_n \times Z_n$ coordinate;

determining, by one or more processors, a total dynamic productivity index for each $X_n \times Y_n \times Z_n$ coordinate;

determining, by one or more processors, placement of one or more wells for the reservoir responsive to determine the total dynamic productivity index for each $X_n \times Y_n \times Z_n$ coordinate; and generating, by one or more processors, a production analysis report for the reservoir, the production analysis report including an assessment of well placement for the reservoir;

determining, by one or more processors, placement of one or more wells for the reservoir responsive to the total dynamic productivity index for each $X_n \times Y_n \times Z_n$ coordinate and minimum spacing between the one or more wells; and placing one or more wells in the reservoir based on the total dynamic productivity index for each $X_n \times Y_n \times Z_n$ coordinate and minimum spacing between the one or more wells.

5. The system of claim 4, wherein the productivity index is calculated using the formula:

$$PI = q/(P_i - P_{wf})$$

wherein PI is the productivity index, q is a well production rate in barrels per day, $P_i$ is an average block pressure in pounds per square inch, and $P_{wf}$ is a near wellbore flowing pressure in pounds per square inch.

6. The system of claim 4, wherein determining the placement of the one or more wells is further responsive to minimum spacing between the one or more wells.

7. The system of claim 6, wherein the placement of the one or more wells is determined using the following formulas:

$$\text{maximize} \sum_{(i,j) \in I \times J} p_{(i,j)} x_{(i,j)} \quad \text{Equation 1}$$

$$\text{subject to } x_{(i_1,j_1)} + x_{(i_1,j_2)} \le 1, \quad \text{Equation 2}$$

$$\begin{cases} (i_1, j_1), (i_2, j_2) \in I \times J \\ \sqrt{(i_1 - i_2)^2 + (j_1 - j_2)^2} < D \end{cases}$$

$$\sum_{(i,j) \in I \times J} x_{(i,j)} \le N \quad \text{Equation 3}$$

$$x_{(i,j)} \in \{0, 1\} \quad (i,j) \in I \times J$$

wherein, variable $X_{(i,j)}$ represents the location (i,j) in the reservoir, $p_{(i,j)}$ represents the total dynamic productivity index at each coordinate, D represents the minimum number of cells, and N represents the maximum number of wells to be optimized.

8. The system of claim 4, wherein the instructions further cause the one or more processors to perform operations of:

generating, by one or more processors, a well placement map using one or more total dynamic productivity index indicators.

9. A computer-implemented method of optimizing well placement of a reservoir, the computer-implemented method comprising the steps of:

determining for a reservoir having a length of $X_n$, width of $Y_n$, and depth of $Z_n$, in a first computer process, a productivity index for each $X_n \times Y_n \times Z_n$ coordinate using a plurality of reservoir metrics associated with the reservoir;

generating, in a second computer process, a grid pattern of the reservoir using the productivity index with time values extracted for each $X_n \times Y_n \times Z_n$ coordinate;

determining, in a third computer process, a total dynamic productivity index for each $X_n \times Y_n \times Z_n$ coordinate responsive to determining the productivity index for each $X_n \times Y_n \times Z_n$ coordinate; and generating, in a fourth computer process, a production analysis report for the reservoir responsive to determining the total dynamic productivity index for each $X_n \times Y_n \times Z_n$ coordinate, the production analysis report including an assessment of well placement for the reservoir;

determining, by one or more processors, placement of one or more wells for the reservoir responsive to the total dynamic productivity index for each $X_n \times Y_n \times Z_n$ coordinate and minimum spacing between the one or more wells; and placing one or more wells in the reservoir based on the total dynamic productivity index for each $X_n \times Y_n \times Z_n$ coordinate and minimum spacing between the one or more wells.

10. A computer-implemented method of claim 9, wherein the method further comprises the step of:

generating, in a fifth computer process, a well placement map using one or more total dynamic productivity index indicators.

11. A computer-implemented method of claim 9, wherein the productivity index is calculated using the formula:

$$PI = q/(P_i - P_{wf})$$

wherein PI is the productivity index, q is a well production rate in barrels per day, $P_i$ is an average block pressure in pounds per square inch, and $P_{wf}$ is a near wellbore flowing pressure in pounds per square inch.

12. The computer-implemented method of claim 9, wherein determining the placement of the one or more wells is further responsive to minimum spacing between the one or more wells.

13. A wells placement analysis system, the system comprising:

one or more processors;

one or more input/output units adapted to be in communication with the one or more processors;

one or more databases adapted to store and associate a plurality of reservoir metrics with a plurality of coordinates to thereby define one or more reservoir databases, the one or more reservoir databases in communication with the one or more processors;

one or more non-transitory computer-readable mediums positioned in communication with the one or more processors and having one or more computer programs stored thereon including a set of instructions that when executed by one or more processors cause the one or more processors to perform operations of:

determining, by one or more processors, for a reservoir a productivity index for each coordinate using to one or more of the plurality of reservoir metrics associated with the reservoir;

generating, by one or more processors, a grid pattern of the reservoir using the productivity index with time values extracted for each coordinate;

determining, by one or more processors, a total dynamic productivity index for each coordinate;

determining, by one or more processors, placement of one or more wells for the reservoir responsive to determine the total dynamic productivity index for each coordinate and responsive to minimum spacing between the one or more wells;

wherein the placement of the one or more wells is determined using the following formulas:

$$\text{maximize} \sum\nolimits_{(i,j) \in I \times J} p_{(i,j)} x_{(i,j)} \quad \text{Equation 1}$$

-continued $$\text{subject to } x_{(i_1, j_1)} + x_{(i_1, j_2)} \leq 1, \quad \text{Equation 2}$$

$$\begin{cases} (i_1, j_1), (i_2, j_2) \in I \times J \\ \sqrt{(i_1 - i_2)^2 + (j_1 - j_2)^2} < D \end{cases}$$

$$\sum\nolimits_{(i,j) \in I \times J} x_{(i,j)} \leq N \quad \text{Equation 3}$$

$$x_{(i,j)} \in \{0, 1\} \quad (i, j) \in I \times J$$

wherein, variable $X_{(i,j)}$ represents the location (i,j) in the reservoir, $p_{(i,j)}$ represents the total dynamic productivity index at each coordinate, D represents the minimum number of cells, and N represents the maximum number of wells to be optimized; and generating, by one or more processors, a production analysis report for the reservoir, the production analysis report including an assessment of well placement for the reservoir; and placing one or more wells in the reservoir based on the total dynamic productivity index for each $X_n \times Y_n \times Z_n$ coordinate and minimum spacing between the one or more wells.

* * * * *